US010112405B2

(12) United States Patent
McNeilly et al.

(10) Patent No.: US 10,112,405 B2
(45) Date of Patent: *Oct. 30, 2018

(54) REPLACEABLE LIQUID SUPPLY HAVING CUT OUTS AND LATCH

(71) Applicant: HEWLETT-PACKARD DEVELOPMENT COMPANY, L.P., Houston, TX (US)

(72) Inventors: John McNeilly, Dublin (IE); Fiona Coyle, Dublin (IE); Patrick Lynch, Lucan (IE); William S. Osborne, Camas, WA (US); David B. Novak, Philomath, OR (US); John Breen, Ballivor (IE); Kevin Rourke, Leixlip (IE); Declan Coyne, Leixlip (IE); James Mannion, Leixlip (IE); Bryan Murphy, Lucan (IE); John Doran, Dublin (IE); Eugene Cahill, Kells (IE)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/642,504

(22) Filed: Jul. 6, 2017

(65) Prior Publication Data

US 2017/0320330 A1 Nov. 9, 2017

Related U.S. Application Data

(63) Continuation of application No. 15/110,069, filed as application No. PCT/US2014/012292 on Jan. 21, 2014, now Pat. No. 9,738,084.

(51) Int. Cl.
*B41J 2/175* (2006.01)

(52) U.S. Cl.
CPC ......... *B41J 2/17553* (2013.01); *B41J 2/1752* (2013.01); *H05K 999/99* (2013.01)

(58) Field of Classification Search
CPC ............................ B41J 2/17553; B41J 2/1752
USPC ............................................................ 347/86
See application file for complete search history.

(56) References Cited

U.S. PATENT DOCUMENTS

| | | | | |
|---|---|---|---|---|
| 5,661,510 | A | 8/1997 | Brandon et al. | |
| 5,686,947 | A * | 11/1997 | Murray ................ | B41J 2/17513 347/85 |
| 6,179,415 | B1 * | 1/2001 | Okazaki ............... | B41J 2/17513 347/49 |
| 6,196,670 | B1 | 3/2001 | Saruta | |
| 6,196,671 | B1 | 3/2001 | Breemes et al. | |

(Continued)

FOREIGN PATENT DOCUMENTS

| | | |
|---|---|---|
| CN | 102834268 | 12/2012 |
| EP | 0829363 | 3/1998 |

(Continued)

*Primary Examiner* — Huan Tran
*Assistant Examiner* — Alexander D Shenderov
(74) *Attorney, Agent, or Firm* — HP Inc. Patent Department

(57) ABSTRACT

Liquid supply or reservoir therefore having multiple compartments, each compartment to hold a distinct liquid, comprising multiple liquid outlets, each fluidically connected to one of the compartments, multiple clearance cut outs disposed at a pitch equal to a pitch of the compartments to accommodate protrusions of a dispenser, and at least one latch protruding outwards from a supply wall.

20 Claims, 6 Drawing Sheets

(56) References Cited

U.S. PATENT DOCUMENTS

| | | | |
|---|---|---|---|
| 6,280,024 B1 | 8/2001 | Miyazawa et al. | |
| 6,488,368 B2 | 12/2002 | Petersen et al. | |
| 6,508,547 B2 | 1/2003 | King et al. | |
| 6,607,262 B2 | 8/2003 | Paul et al. | |
| 6,783,220 B2 | 8/2004 | Ujita et al. | |
| 7,344,233 B2 | 3/2008 | Studer et al. | |
| 8,292,411 B2 | 10/2012 | Anderson, Jr. et al. | |
| 9,738,084 B2 * | 8/2017 | McNeilly | B41J 2/1752 |
| 2003/0202062 A1 * | 10/2003 | Steinmetz | B41J 2/1752 347/86 |
| 2009/0058958 A1 * | 3/2009 | Wang | B41J 2/17546 347/86 |
| 2010/0103230 A1 | 4/2010 | Anderson, Jr. et al. | |
| 2012/0001990 A1 * | 1/2012 | Rittgers | B41J 2/175 347/86 |
| 2012/0268534 A1 | 10/2012 | Gomez et al. | |
| 2013/0194354 A1 | 8/2013 | Petruchik | |

FOREIGN PATENT DOCUMENTS

| | | |
|---|---|---|
| EP | 1122076 | 8/2001 |
| EP | 2552704 | 2/2013 |
| WO | WO-2005113245 | 12/2005 |

* cited by examiner

REPLACEABLE LIQUID SUPPLY HAVING CUT OUTS AND LATCH

BACKGROUND

Certain types of liquid dispensers are provided with receiving slots to receive replaceable individual liquid supplies and with permanent or semi-permanent dispense heads to receive liquids from the supplies. Supplies for these types of dispensers do not have an integral dispense head, but rather, liquid outlets to supply liquids to the dispenser. The receiving slots of the dispenser are to aid in fluidically connecting the liquid supplies to the inlets. Typically the liquid dispensers are to receive multiple liquid supplies that hold distinct liquids, to dispense the distinct liquids onto media. For example, certain inkjet printers are provided with permanent or semi-permanent printheads and four separate receiving slots to receive individual C, M, K and Y ink supplies.

DRAWINGS

DESCRIPTION

Figure 1:
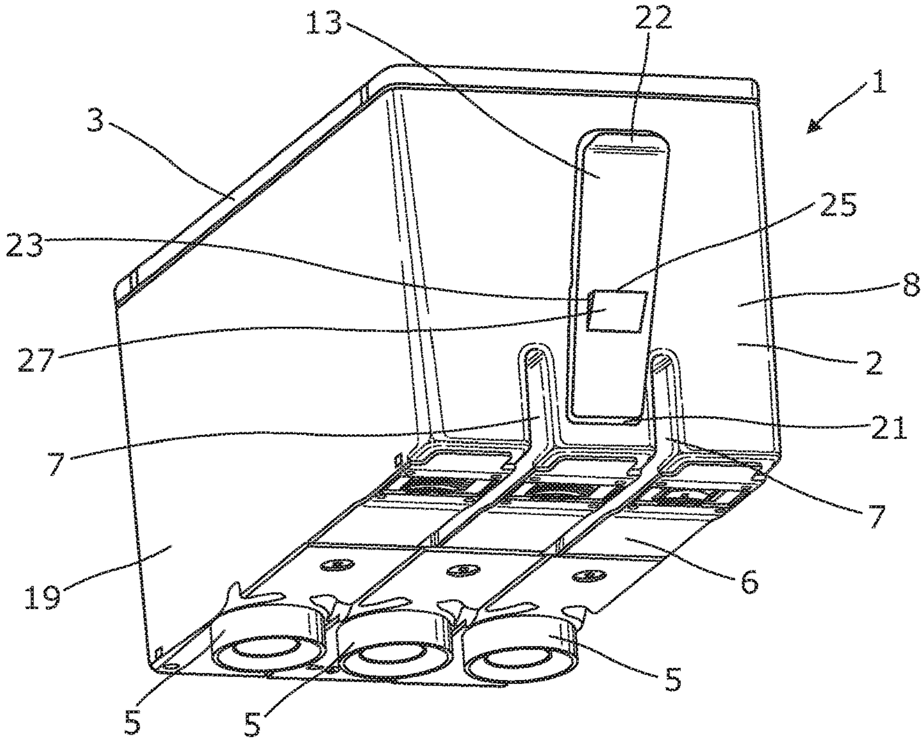
FIG. 1 illustrates an example of a supply in perspective view.
Figure 2:
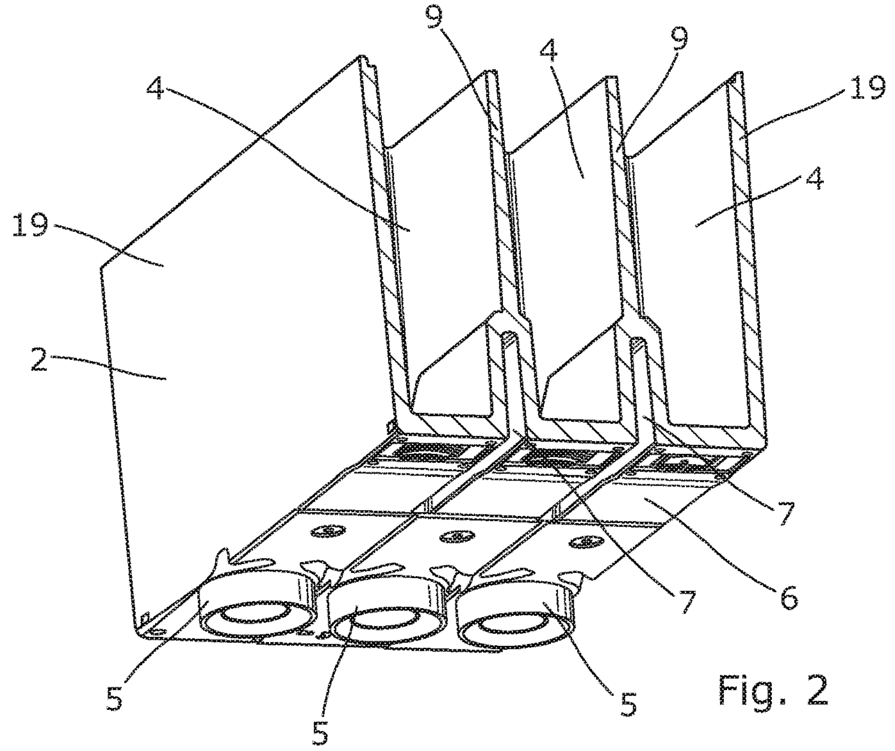
FIG. 2 illustrates an example of a reservoir of the supply of FIG. 1 in a perspective, cross sectional view.
Figure 3:
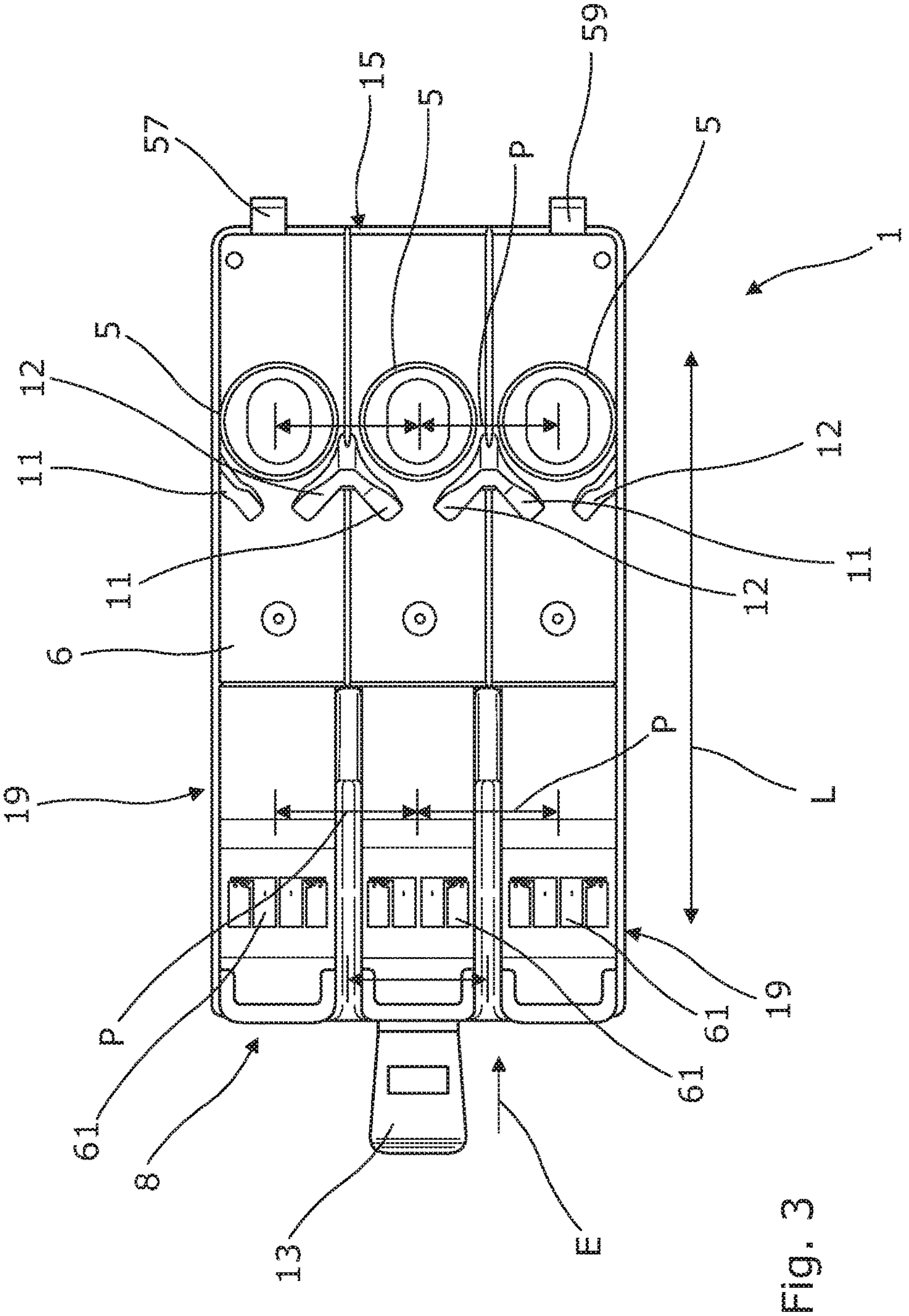
FIG. 3 illustrates an example bottom view of the supply of FIG. 1.

FIGS. 1-3 illustrate respective portions of a replaceable multiple compartment liquid supply 1 that is to be connected to a liquid dispenser in a replaceable manner. In the illustrated example, the supply 1 includes a compartment and outlet forming portion, herein called reservoir 2, and a lid 3. FIG. 1 illustrates a perspective view on the supply 1. FIG. 2 illustrates a cross section of the reservoir 2 of FIG. 1 without lid 3. FIG. 3 illustrates a bottom view of the supply 1. The supply 1 of this disclosure includes multiple compartments 4. In the illustrated example the supply 1 includes three compartments 4.

Each compartment 4 of the reservoir 2 holds a distinct liquid. In one example the supply 1 is a tri-color ink supply 1 holding Cyan, Magenta and Yellow ink, to be connected to an inkjet printer. The compartments 4 contain capillary media for holding the ink. In other examples the supply holds different liquids such as 3D printing agents or pharmaceutical or laboratory liquids, wherein the dispenser is a 3D printer, a digital titration device or other type of dispenser. The dispensers may be arranged to dispense the distinct liquids onto media such as a 3D printing powder or an array of wells or assay plates.

As illustrated, the reservoir 2 includes separation walls 9 between the compartments 4. The reservoir 2 includes three elongate compartments 4 that are arranged in parallel along a longitudinal direction L of the supply 1. Each separation wall 9 is a singular wall between two compartments 4. In the illustrated three-compartment supply 1 two separation walls 9 extend in said longitudinal direction L of the compartments 4, the longitudinal direction L being parallel to side walls 19, the separation walls 9 defining the three compartments 4 within the supply 1. In other examples, other compartment arrangements may be used. For example two compartments may extend parallel to each other and one other compartment may extend at the heads of these two compartment. In yet another example three compartments may extend in a traverse direction with respect to the supply.

The supply 1 includes multiple liquid outlets 5 each fluidically connected to a respective compartment 4 to supply respective liquids to corresponding dispenser inlets when connected. In certain examples, the outlets 5 include a filter that is fluidically connected to ink holding capillary media in the compartment 4. The supply 1 includes at least one clearance cut outs 7 that extends into and through a respective supply wall 6, in this example a bottom wall 6. The at least one clearance cut out 7 is to accommodate protrusions of a corresponding dispenser, to allow insertion of the multi-liquid supply 1 in a dispenser with multiple individual slots intended for receiving single liquid supplies, as will be explained later with reference to FIGS. 4-6. Furthermore a protruding latch 13 protrudes outwards from an outer wall 17 of the supply 1, for example a back wall, to facilitate securing of the supply 1 to at least one corresponding engage feature in one of the dispenser receiving slots.

In one example, the supply 1 is compatible with a dispenser that is originally intended to receive individual, single-liquid supplies, because the clearance cut outs 7 clear corresponding protrusions of the dispenser that would normally occupy spaces between separately installed individual supplies. The multi-liquid supply 1 of this disclosure occupies approximately the same space within such dispenser as multiple individual-liquid supplies, while being capable of holding more liquid in each compartment 4 with respect to individual-liquid supplies, because there is only one wall between the compartments 4 instead of two walls and some empty space. In addition, the protruding latch may facilitate easy and secure locking and unlocking of the supply 1 to a dispenser, with only a single insertion or release motion, and with less risk of trying to connect a supply in a wrong slot as compared to individual-liquid supplies.

Figure 4:
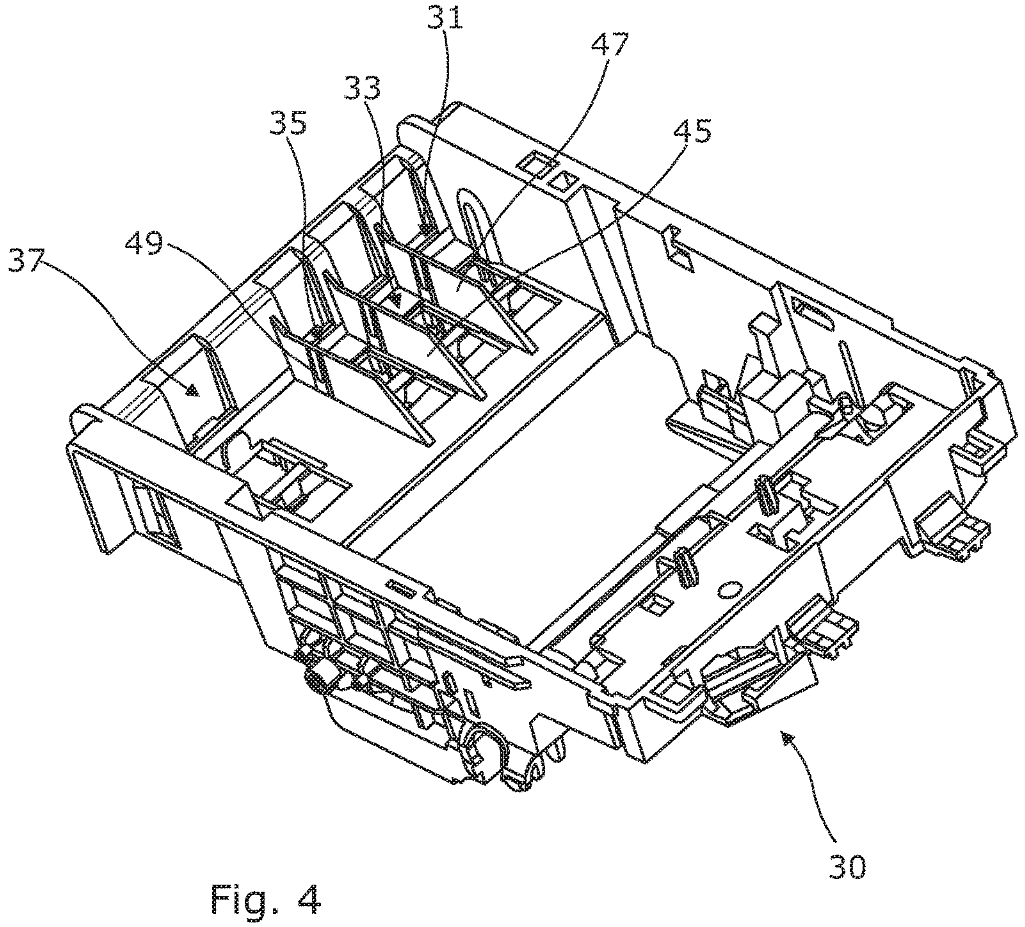
FIG. 4 illustrates and example receiving structure for the supply of FIG. 1.
Figure 5:
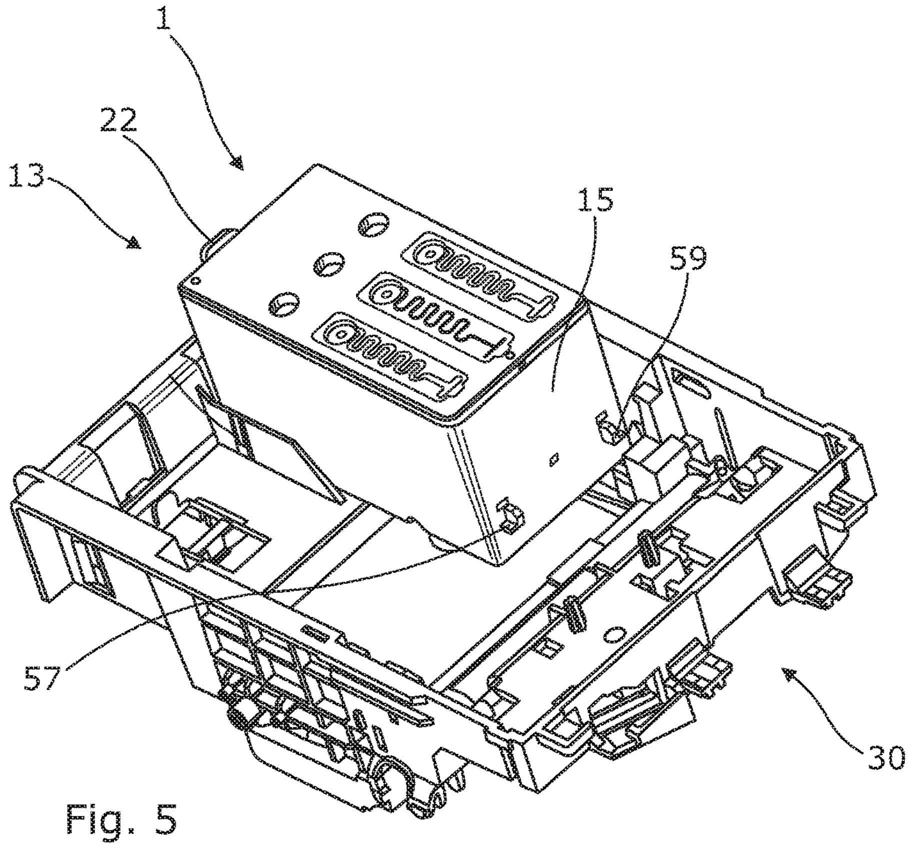
FIG. 5 illustrates the example supply of FIG. 1 installed in the example receiving structure of FIG. 4.
Figure 6:
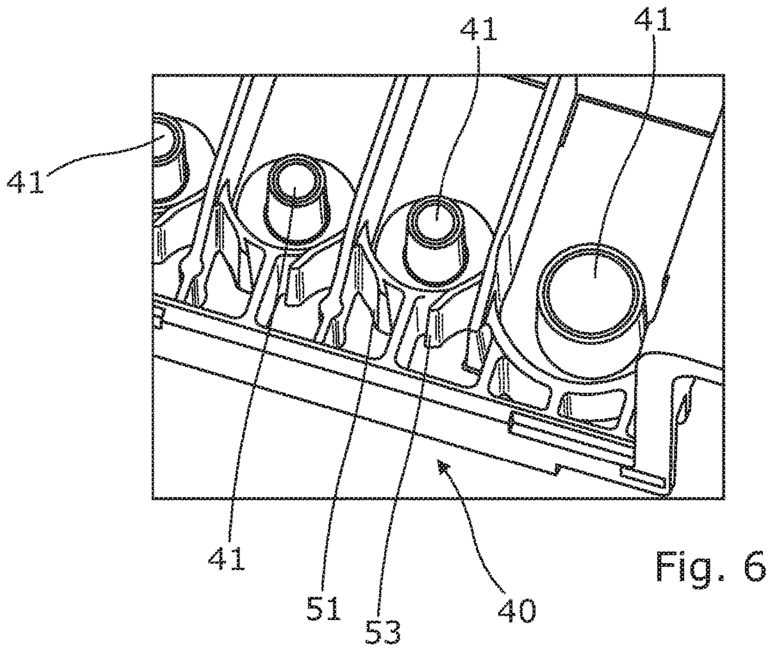
FIG. 6 illustrates example inlets for the receiving structure of FIGS. 4 and 5.

FIGS. 4-6 illustrate an example receiving structure 30 with receiving slots 31, 33, 35, 37 for receiving a supply 1 of this disclosure. FIG. 4 illustrates the receiving structure 30 without a supply 1. FIG. 5 illustrates the receiving structure 30 with a supply 1 installed. FIG. 6 illustrates a fluidic interconnect portion 40 that is to be disposed under the receiving structure 30 of FIGS. 4 and 5, so that inlet towers 41 of the fluidic interconnect portion 40 extend through corresponding openings in the receiving structure 30 to connect to the outlets 5 when the supply 1 is installed in the receiving structure 30.

The receiving structure 30 has four receiving slots 31, 33, 35, 37, of which three receiving slots have a pitch of approximately 12.8 millimeter, as measured between center lines of each of the slots, to receive individual-liquid supplies having a width of less than 12.8 millimeters, for example individual color ink supplies. A fourth receiving slot 37 may be wider to receive a larger individual liquid supply, for example a black ink supply, and may therefore have a different pitch. Corresponding fluidic interconnect towers 41 that are illustrated in FIG. 6 have a pitch measured between central axes of the inlet towers 41, that is equal to the pitch of the corresponding receiving slots 31, 33, 35, 37, for example 12.8 millimeters.

The receiving slots 31, 33, 35, 37 are defined by protrusions in the form of fins 45, 47, 49. While normally these fins 45, 47, 49 would guide individual-liquid supplies between the fins 45, 47, 49 to each inlet tower 141, with the supply 1 of this disclosure the fins 45, 47 are cleared by the clearance cut outs 7 of the supply 1 so that one supply 1 may cover three receiving slots 31, 33, 35 of the receiving structure 30. A single latch 13 may then secure the supply 1 to the multiple receiving slots 31, 33, 35, thereby maintaining the fluidic connection between multiple the outlet towers 5 of the supply 1 and the inlet towers 41 of the multiple receiving slots 31, 33, 35. Cooperation between the fins 45, 47 and clearance cut outs 7 may provide for extra guidance and stability.

In an example, in addition to the fins 45, 47, further guide protrusions 51, 53 are provided in the receiving slots 31, 33, 35, intended to guide certain portions of a bottom face 6 of each individual-ink supply (FIG. 6). Example further guide protrusions 51, 53 can be provided near the inlets 41 to guide the outlet of each supply to the inlet 41.

Turning again to FIGS. 1-3, the liquid outlets 5 can be formed by cylindrical protrusions in the form of towers that protrude from a bottom face 6 of the supply 1, to supply the liquids in a downwards direction, which may be a dispense direction of a corresponding dispenser. The outlets 5 are provided in the bottom face 6, near a front face 15 of the supply 1. In another example the outlets 5 can be provided in another face of the supply 1 such as the front face 15. In an example that corresponds to the receiving structure of FIGS. 4-6, a pitch P of central axes of the outlets 5 is similar or equal to the pitch of the inlets 141, for example approximately 12.8 mm (FIG. 3). The compartments 4 are disposed at a similar pitch P. For example the compartment pitch P is measured between center lines between side walls 9, 19 that define each compartment 4, the side walls 9, 19 being formed by the separation walls 9 and/or the supply side walls 19.

In the illustrated example clearance cut outs 7 are provided between the compartments 4, directly under the separation walls 9, to receive fins of a dispenser that are intended to separate receiving slots. In the illustrated example the clearance cut outs 7 are provided at least partly through a bottom face 6 of the reservoir 2 and at least partly through a back face 8 of the reservoir 2. In an example, the clearance cut outs 7 are disposed at a pitch that is equal or similar to a pitch of the outlets 5. The multiple compartment reservoir 2 with clearance cut outs 7 may form a single cast, that is, monolithic shape, as best illustrated in FIG. 2.

In an example, the supply 1 includes second and third clearance cut outs 11, 12 that are disposed directly under the compartments 4. The second and third clearance cut outs 11, 12 are to clear second protrusions in the dispenser that are provided within each receiving slot, for example the guide protrusions 51, 53 illustrated in FIG. 6. The second and third clearance cut outs 11, 12 can be provided near the outlet 5, for example partly around the outlet 5. A pitch of each of the second and third clearance cut outs 11, 12 near each outlet can be equal to a pitch of the outlets 5.

In the illustrated example, the latch 13 has a generally rectangular shape. The latch 13 protrudes from a back face 8 of the supply 1. The latch 13 is to be moved between two extreme positions for latching and unlatching. The latch 13 of FIGS. 1 and 3 is illustrated in an extended, unlatched position. In the illustrated example the latch 13 is to be pivoted between two differently inclined positions. For example, the latch 13 is connected to a back face 8 of the main reservoir body and near a bottom face 6, through a live hinge 21 about which the latch 13 is to be pivoted. The latch 13 can be pivoted in a direction inwards E, for example to unlatch the supply 1 when it is installed, by pushing a latch grip 22 inwards. In the inwardly inclined state the live hinge 21 undergoes stresses that try to force the latch 13 outwards towards its initial position. Hence when, after pushing the latch 13 inwards, the latch 13 is released again, the latch 13 will flip back towards the extended position.

An example of a supply 1 has only a single latch grip 22 at a distal end of the latch 13. Having a single grip 22 for all three compartments 4 may facilitate easier latching and unlatching. The example latch 13 further includes a latch stop 23 on the main outer surface of the latch 13, to latch to a corresponding engagement feature in a dispenser slot. As illustrated, the latch stop 23 may include a stop surface 25 and a ramp 27.

While each dispenser slot may include corresponding latch engagement features, intended for individual-liquid supplies, in the illustrated example the multiple-liquid supply 1 includes only a single latch 13 for latching to only one of the receiving slots. In one example the single latch 13 is attached to the back face 8 near the middle compartment 4, between the two clearance cut outs 7. A single latch 13 may allow for relatively easy insertion and latching in one motion.

Figure 7:
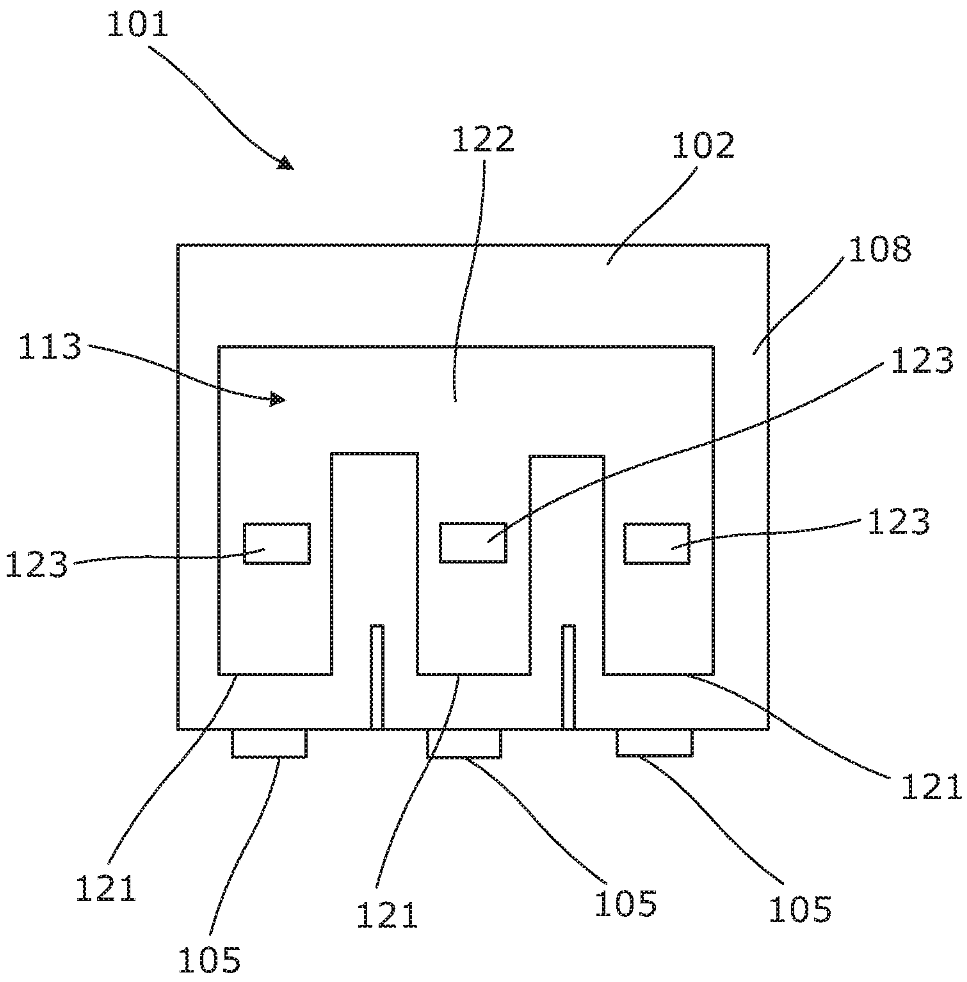
FIG. 7 illustrates another example supply in a back view.

In another example that is diagrammatically illustrated in FIG. 7 a multiple-liquid supply 101 with multiple compartments includes a latch 113 with a single latch grip 122 and multiple latch stops 123 on multiple latch legs connected through the reservoir 102 multiple live hinges 121, for example one for each compartment, so that the latch 113 engages multiple corresponding receiving slot engagement features. Here, having a single latch grip 122 may facilitate unlatching of all latch stops 123 in one motion with one finger. In other examples that are not illustrated multiple latch legs with separate latch grips can be provided.

In an example the supply 1 includes at least one protruding key 57, 59 to be inserted in a corresponding keying aperture of one of the receiving slots, as best illustrated in FIGS. 3 and 5. The key 57, 59 is provided in addition to the latch 13. For the example supply 1, the key 57, 59 has a retaining function. The key 57, 59 may also form a pivot point during insertion of the supply 1, whereby the back face 8 and latch 13 are pivoted about the key 57, 59 until the supply 1 is properly seated and latched. The key 57, 59 may be disposed at the opposite face 15 of the latch 13, in this example being the front face 15. The supply 1 may include multiple keys 57, 59, for example two or three keys 57, 59. Each key 57, 59 may have a distinct shape or orientation to match corresponding key slots in the receiving slots of the dispenser that may have been originally intended for color lock out keys of individual liquid supplies. The keys 57, 59 may have a profile shape, such as a T-profile or L-profile or inversed or mirrored versions thereof.

The keys 57, 59 have a pitch that is a discrete number (e.g. 1, 2 or 3) times the pitch of the outlets 5. In the illustrated example the key pitch is two times the pitch of the outlets 5. In the example, the keys 57, 59 are provided on the lateral compartments 4 whereas there is no key connected to the middle compartment 4. In one example, having keys 57, 59 near the outer compartments 4 may provide for a relatively stable retaining function, maintaining all fluidic connections, while keeping insertion relatively easy.

In certain examples, the supply has a total number of keys 57, 59 or latch grips 22 that is less than the total number of liquid compartments 4. Although the illustrated examples include multiple keys 57, 59 and a single latch 13 with a single latch stop 23, in other examples the supply can comprise only one key and for example multiple latch stops 123.

As illustrated in FIG. 3, the supply 1 may include multiple storage circuits 61 each below a corresponding compartment 4. In the illustrated example there is provided one separate storage circuit 61 for each compartment 4. The storage circuits 61 are provided at the same pitch as the outlets 5 to connect to respective interconnect circuits of each receiving slot. Each storage circuit 61 may be aligned with each outlet 5, for example adhered against the bottom face 6, near a back face 8 and aligned between the side walls 9, 19 of each compartment 4. The hardware of the multiple storage circuits 61 can be substantially identical. For example the chip or memory circuit hardware is substantially identical, except for example certain imprinted codes or numbers. The storage circuits 61 can be defined as non-volatile non-transitory memory circuits.

Each of the storage circuits 61 stores at least partly distinct data wherein each distinct data relates to one of the individual liquids. For example each storage circuit 61 can include mutually distinct color information and/or color profile information pertaining to the respective liquid, and respective data fields for distinct ink fill information of each respective compartment 4 during usage. Ink fill data on each storage circuit 61 may be distinct during usage. The storage circuits 61 may also include mutually identical data such as printer data to match the supply 1 to compatible printers or initial ink fill information or data fields, or a supply product number. In other example supplies 1, one or two storage circuits may be used to store the information pertaining to three compartments 4.

Figure 8:
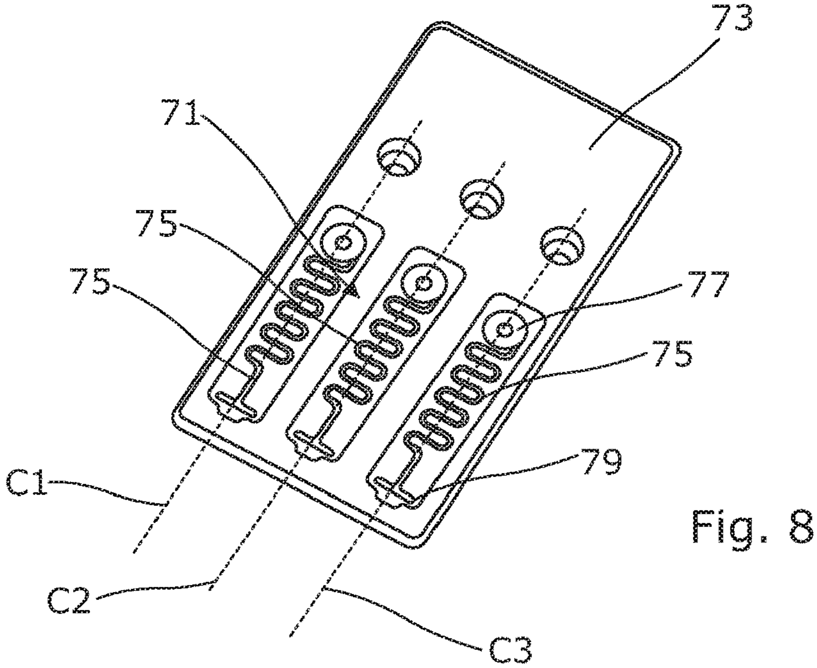
FIG. 8 illustrates an example of a lid with vent assembly.
Figure 9:
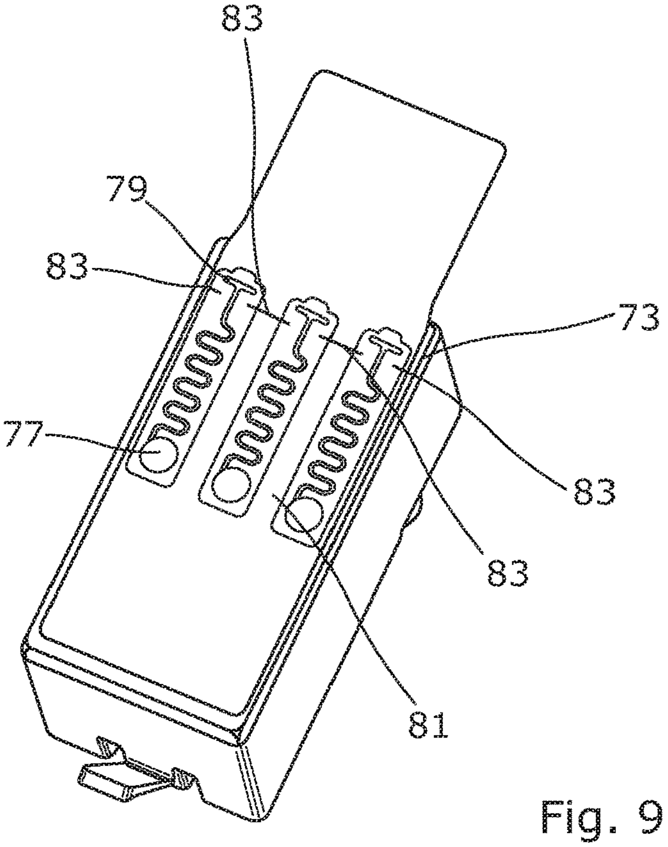
FIG. 9 illustrates the lid of FIG. 8 with an example seal, herein partly transparent for illustrative purposes.

With reference to FIGS. 8 and 9, the supply 1 includes a vent assembly 71 to vent each compartment 4. The vent assembly 71 is provided in a top face of the supply 1. In the illustrated example the top face is defined by a lid 73. In the illustrated example the vent assembly 71 includes at least three vents 75 separately communicating each compartment 4 with ambient air. The individual vents 75 are maintained separately to prevent mixing of liquids that could occur if a liquid would travel up one of the vents 75 and down another. Each vent 75 includes a compartment vent hole 77 at one end of the vent 75 that communicates directly with the compartment 4, and an ambient vent hole 79 at an opposite end that is to communicate directly with ambient air during usage of the supply 1, after tearing a seal 81. The vent 75 includes an elongate serpentine air channel between said holes 77, 79. The vents 75 are each formed by a cut out integrally molded with the lid 73. At least one seal 81 in the form of a label seals the vents 75, as illustrated in FIG. 9.

In the example illustrated in FIG. 8, the serpentine channel of each vent 75 zigzags about a central axis C1, C2, C3, whereby the central axes C1, C2, C3 of the vents 75 are mutually parallel and parallel to side walls 19 of the supply 1. In the illustrated example the vents 75 are provided at a pitch that is equal to the pitch of the outlets 5, whereby the pitch may be based on the distance between the central axes C1, C2, C3 of the vents 5. In another example the pitch between the vents 75 may be more than the pitch of the outlets 5. For example, the ambient vent holes 79 have a pitch that is equal to or more than the pitch of the outlets 5. For example, the vents 75 could diverge near the ambient vent hole 79. The individual vents 75 and the ambient vent holes 79 are distanced to prevent color mixing before and/or after tearing the seal 81.

FIG. 9 illustrates the seal 81 that covers the vents 75, wherein the vents 75 illustrated for explanatory purposes. In this example one seal 81 seals the three vents 75 during shipment and on the shelves, until it is partly torn off. The seal 81 is determined by the relative impermeability of the seal 81, and by an adhesive and/or welding region around the vents 75. The seal 81 includes a grip tab 82. Using the tab 82, tearing the seal 81 near the ambient vent hole 79 will uncover the ambient vent holes 79 and communicate each compartment 4 with ambient air through each respective vent 75. The grip tab 82 can be gripped with the fingers to tear off the seal 81 from all vents 75 in one tearing movement. The grip tab 82 may span the width of the vent assembly 71, approximately. For example the tab 82 may span said three central axes C1, C2, C3, for example to aid in uncovering all three ambient vent holes 79 in one tearing movement. At least one tear line 83 may be provided, at least partly across the seal 81 to aid in tearing the seal 81 in a desired region near the ambient vent holes 79. In an example, the at least one tear line 83 is defined by cut-outs or cut-throughs of the seal 81. In the illustrated example multiple tear lines 83 are provided, in line with each other, that are interrupted near each vent channels 75 to maintain proper sealing near the vents 75. The at least one tear line 83 can extend perpendicular to the central axes C1, C2, C3 of the vents 75, near the ambient vent hole 79.

Other examples of a multiple compartment supply may have multiple separate, disconnected vent seals with separate grip tabs. Further examples have multiple seals that each seal a vent 75 wherein the multiple seals are connected through one grip tab. Other example supplies may have vents that unify or converge near the ambient vent hole. Again further examples of the supply may have multiple separate latches with separate grips. Again, further examples of the supply may have three individual keys. Certain example supplies 1 include only two compartments and other example supplies include four or more compartments 4. Certain examples of the supply have multiple ink colors, for example four ink colors that include black, cyan, magenta and yellow to cover all colors of a printer in one supply.

As noted at the beginning of this description, the examples shown in the figures and described above illustrate but do not limit the invention. Other examples are possible. Therefore, the foregoing description should not be construed to limit the scope of the invention, which is defined in the following claims.

What is claimed is:

1. A replaceable liquid supply to connect to a liquid dispenser, comprising:

multiple compartments separated by single internal walls each compartment to hold a distinct liquid, and multiple liquid outlets, each fluidically connected to one of the compartments, to supply respective liquids to corresponding dispenser inlets of distinct receiving slots of a dispenser, and multiple clearance cut outs disposed at a pitch equal to a pitch of the outlets to accommodate protrusions of a dispenser, wherein the clearance cut outs are disposed between the compartments.

2. The replaceable liquid supply of claim 1, further comprising at least one latch to move between a latch and unlatch position and having a latch engagement end for latching and unlatching the supply to the liquid dispenser.

3. The replacement liquid supply of claim 2, further comprising a total number of latches that is less than a number of the multiple compartments in the supply.

4. The replaceable liquid supply of claim 1, further comprising at least one protruding key to be inserted in a corresponding keying aperture of one of the receiving slots.

5. The replaceable liquid supply of claim 1, further comprising at least two distinctly shaped keys wherein a pitch of the keys is a discrete number times the pitch of the outlets.

6. The replaceable liquid supply of claim 1, further comprising:

a vent assembly comprising multiple vents each communicating with one compartment; and at least one seal covering the multiple vents.

7. The replaceable liquid supply of claim 6, further comprising ambient vent holes that are disposed at a pitch that is approximately equal to or more than the pitch of the outlets.

8. The replaceable liquid supply of claim 6, further comprising a grip tab that spans a width of the vent assembly.

9. The replaceable liquid supply of claim 6, further comprising comprising one seal to cover all vents.

10. The replaceable liquid supply of claim 9, wherein the seal comprises tear lines across the seal that are interrupted near each vent.

11. The replaceable liquid supply of claim 6, wherein the vents are identically shaped.

12. The replaceable liquid supply of claim 1, wherein the liquid outlets are disposed in a bottom face to supply liquid in a downwards direction.

13. The replaceable liquid supply of claim 1, wherein further clearance cut outs are disposed directly under the compartments.

14. The replaceable liquid supply of claim 1, wherein the clearance cut outs are sized and positioned to accommodate the protrusions of the liquid dispenser, where those protrusions are positioned to separate individual liquid supplies installed in the dispenser.

15. The replacement liquid supply of claim 1, wherein the clearance cut outs are open on both a bottom face and a back face of the supply.

16. The replacement liquid supply of claim 1, further comprising a second group of multiple clearance cut outs disposed partially around the outlets of the multiple liquid outlets.

17. The replacement liquid supply of claim 1, further comprising a total number of keys that is less than a number of the multiple compartments in the supply.

18. A replaceable liquid supply to connect to a liquid dispenser, comprising:

multiple compartments separated by single internal walls each compartment to hold a distinct liquid; and multiple liquid outlets, each fluidically connected to one of the compartments, to supply respective liquids to corresponding dispenser inlets of distinct receiving slots of a dispenser;

multiple clearance cut outs disposed at a pitch equal to a pitch of the outlets to accommodate protrusions of a dispenser; and multiple storage circuits, each corresponding to one of the compartments and each to contain at least partially distinct data corresponding to one of the distinct liquids.

19. The replaceable liquid supply of claim 18, further comprising at least one latch to move between a latch and unlatch position and having a latch engagement end for latching and unlatching the supply to the liquid dispenser.

20. Single cast multiple compartment liquid reservoir, each compartment to hold a distinct liquid, comprising:

multiple liquid outlet towers protruding from a bottom face, each fluidically connected to one of the compartments;

multiple clearance cut outs disposed at a pitch equal to a pitch of the compartments to accommodate protrusions of a dispenser; and multiple vents each communicating with one compartment, a seal covering the multiple vents, wherein the seal comprises tear lines across the seal that are interrupted at each vent.

* * * * *

UNITED STATES PATENT AND TRADEMARK OFFICE

CERTIFICATE OF CORRECTION

PATENT NO. : 10,112,405 B2
APPLICATION NO. : 15/642504
DATED : October 30, 2018
INVENTOR(S) : John McNeilly et al.

It is certified that error appears in the above-identified patent and that said Letters Patent is hereby corrected as shown below:

In the Claims

In Column 7, Line 25, Claim 9, after "comprising" delete "comprising".

Signed and Sealed this
Ninth Day of April, 2019

Andrei Iancu
*Director of the United States Patent and Trademark Office*